United States Patent [19]
Young et al.

[11] Patent Number: 5,994,204
[45] Date of Patent: Nov. 30, 1999

[54] SILICON-GLASS BONDED WAFERS

[75] Inventors: William Ronald Young; Anthony L. Rivoli, both of Palm Bay, Fla.

[73] Assignee: Harris Corporation, Melbourne, Fla.

[21] Appl. No.: 08/884,787

[22] Filed: Jun. 30, 1997

Related U.S. Application Data

[62] Division of application No. 08/573,099, Dec. 15, 1995, Pat. No. 5,729,038, which is a continuation of application No. 08/223,359, Apr. 5, 1994, abandoned.

[51] Int. Cl.$^6$ .................................................. H01L 21/60
[52] U.S. Cl. ........................................... 438/455; 438/459
[58] Field of Search ................................ 156/281, 272.9, 156/630.1, 631; 438/455, 456, 457, 458, 459

[56] References Cited

U.S. PATENT DOCUMENTS 5,750,000  5/1998  Yonehara et al. .................... 156/630.1
5,755,914  5/1998  Yonehara .............................. 156/281

*Primary Examiner*—Carl Whitehead, Jr.
*Attorney, Agent, or Firm*—Charles E. Wands

[57] ABSTRACT

Semiconductor-on-glass integrated circuits may include photodetectors which are stimulated by backside light passing through the glass substrate; this provides information reception by optical communication. Bipolar and field effect transistors are shielded from the light by their buried layers. Further, LEDs integrated together with photodetectors permits all optical communication among glass substrate chips. Alternative uses of glass substrate include thermal isolation for efficient thermally regulated integrated circuits.

15 Claims, 9 Drawing Sheets

SILICON-GLASS BONDED WAFERS

This is a division of application Ser. No. 08/573,099, filed Dec. 15, 1995, now U.S. Pat. No. 5,729,038, issued Mar. 17, 1998, which is a continuation of application Ser. No. 08/223,359, filed Apr. 5, 1994, now abandoned.

BACKGROUND AND SUMMARY OF THE INVENTIONS

The present invention relates to electronic integrated circuits and methods of fabrication, and, more particularly, to semiconductor integrated circuits on dice with transparent substrates.

Silicon-on-insulator substrates

Integrated circuits fabricated in silicon-on-insulator substrates offer performance advantages including freedom from latchup for CMOS structures, high packing density, low parasitic capacitance, low power consumption, radiation hardness, high voltage operation, and the possibility of three dimensional integration. Indeed, isolation trenches extending through the silicon layer down to the insulation provide a simple approach to dielectric isolation of integrated circuit devices. The sidewalls of such trenches are coated with an insulator, usually silicon dioxide ("oxide"), and the remaining portion of trench opening, if any, is filled with a filler which is usually polycrystalline silicon. Diffused PN junctions can also be used for lateral isolation.

Silicon-on-insulator wafer bounding as described by J. Lasky et al., Silicon-On-Insulator (SOI) by Bonding and Etch-Back, 1985 IEDM Tech. Deg. 684 (1985), proceeds as follows: a lightly doped epitaxial layer of silicon is grown on a heavily doped silicon substrate, oxide is thermally grown on the epilayer, a second lightly doped silicon substrate is thermally oxidized, the two oxidized surfaces are pressed together. See FIG. 1a. The pressed together wafers are inserted into an oxidizing atmosphere at 1,100° C. to bond them as illustrated in FIG. 1b. Lastly, grinding and polishing or a preferential etch is used to remove the heavily doped substrate, leaving the thin, lightly doped epitaxially layer above the bonded thermally grown oxides which are now on the second substrate as shown in FIG. 1c. The resulting thin silicon layer above the thermally grown oxide has high quality and the oxide also retains its quality and may be thick, as might be desired for CMOS or high voltage devices, or thin, as might be desired for shared element applications. FIG. 1d heuristically illustrates trench isolation with poly filled trenches isolating MOSFET and bipolar devices.

Co-pending U.S. patent application Ser. No. 07/921,197, filed Jul. 28, 1992 (Linn, Lowry, Rouse, Buller, and Speece), discloses wafer bonding with the use of an oxidizer to lower the temperature of the oxidation bonding as illustrated in FIGS. 2a–c.

Direct wafer bonding of dissimilar materials is well known to those skilled in the art and not discussed in detail.

Integrated circuits formed in semiconductor substrates may incorporate various types of photodetectors. Incident light with sufficiently short wavelength generates electron-hole pairs in the semiconductor and thereby increases the conductivity of photoresistors or the current in photodiodes and phototransistors. The incident light typically enters through an opening in the wiring on the front side of the integrated circuit and forms electron-hole pairs near the surface (penetration of about 1 $\mu$m for yellow-green light in silicon).

Integrated circuits also may be fabricated with light emission sources such as light emitting diodes or lasers, typically made of gallium arsenide type compound semiconductors. This permits optical communication between integrated circuits using optical fibers affixed to the light sources and detectors.

Temperature regulation of integrated circuits can compensate for the temperature coefficients of parameter change for circuits such as voltage references and current sources. However, known regulation methods of temperature sensing and heating a die containing an integrated circuit requires large amounts of power dissipation due to the vertical heat conduction out of a die. Various heat sensitive circuits such as bolometers have used circuits formed in suspended semiconductor films to provide thermal isolation; however, such suspension yields fragile structures.

Features

The present invention provides integrated circuits made in wafers of semiconductor layers bonded to glass substrates and with optically active devices coupling to backside light passing through the glass substrate. Glass substrates also provide enhanced thermal isolation for thermally regulated circuits.

DESCRIPTION OF THE DRAWINGS

The present invention will be described with reference to the accompanying drawings, which are schematic for clarity.

DESCRIPTION OF THE PREFERRED EMBODIMENTS

Overview

Figure 1A:
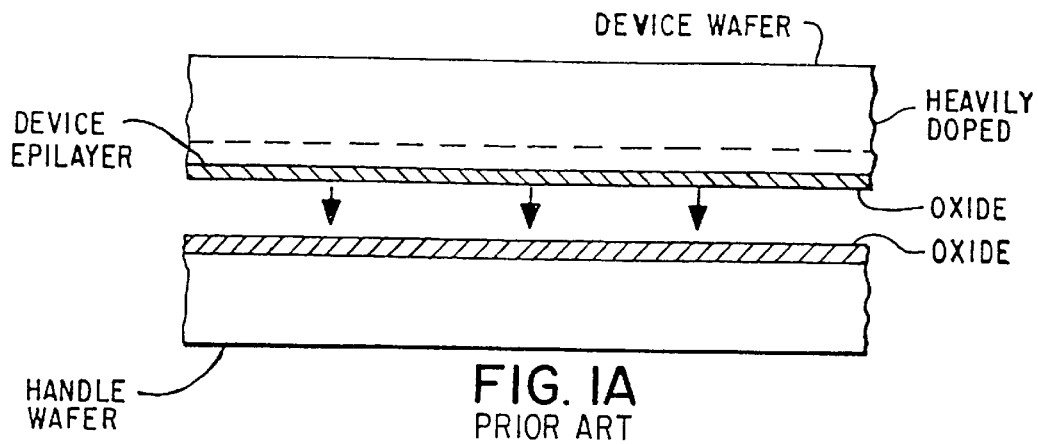
FIGS. 1a–1d illustrate in cross sectional elevation views known wafer bonding methods and integrated circuits.
Figure 1B:
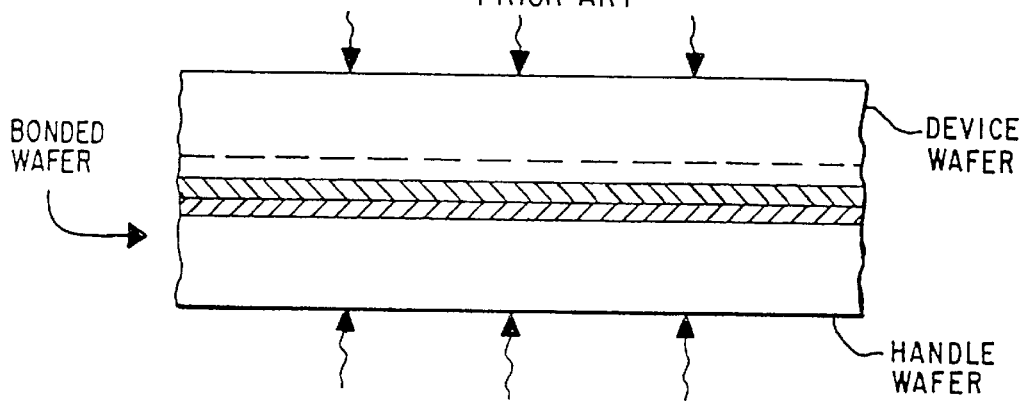
Figure 1C:
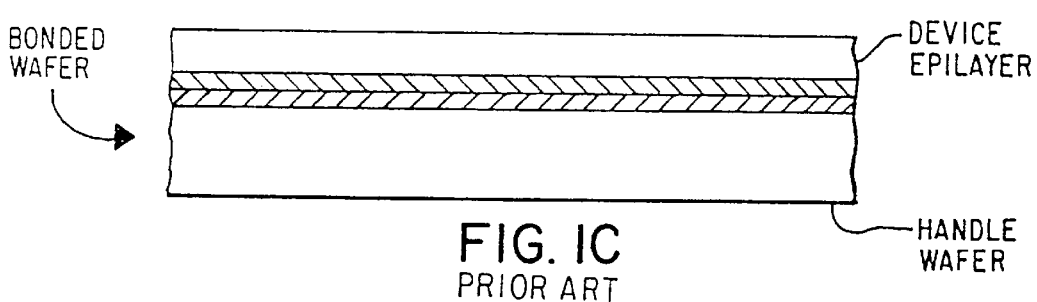
Figure 1D:
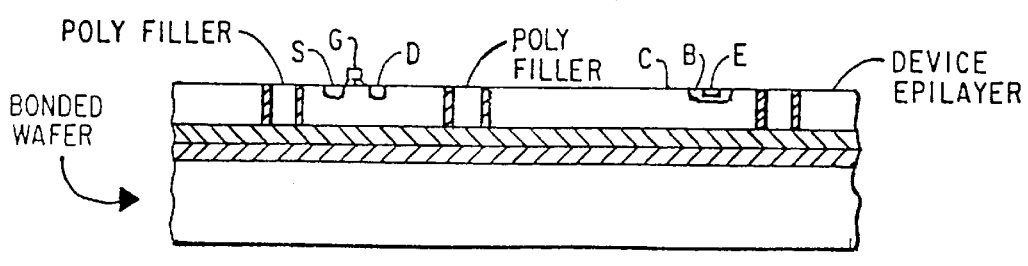

The preferred embodiment structures have integrated circuits formed on glass substrates to take advantage of differences between glass and the semiconductor: glass is optically transparent and glass has a much higher thermal resistivity than silicon or gallium arsenide. In particular, the optically-coupled embodiments rely on light transmission through the glass substrate and incorporate photodetectors and light emitting diodes with heavily doped regions as light shields. Thus optical coupling without waveguides and optical fibers between integrated circuits can be achieved. The thermally insulated embodiments utilize the high thermal resistivity of the glass substrate to make efficient temperature controlled integrated circuits such as voltage references.

First consider the integrated circuit method of fabrication; this will simplify the explanations of the embodiment structures.

First Method of Fabrication

FIGS. 3a–f illustrate in cross sectional elevation view a first preferred embodiment method of fabrication of integrated circuits with dielectric isolation plus photodetectors in the resulting integrated circuit. The method includes the following steps.

(a) Begin with a four inch diameter 500 µm thick silicon device wafer 302 and a comparable diameter glass (fused quartz) handle wafer 312. Device wafer 302 has the doping type and resistivity (e.g., N type and 20 ohm-cm resistivity) desired for eventual device fabrication and has only native oxide on its surfaces. Place drop 305 of silicon-oxidizing aqueous solution of $HNO_3$ and $H_2O_2$ on glass wafer 312; see FIG. 3a. Drop 305 is 20% by volume a 67% $HNO_3$ solution and 80% by volume a 30% $H_2O_2$ solution. Other oxidizers and mixtures also work. Drop 305 has a volume of about 0.05 cc which implies 4.0 microliters per square inch of wafer surface and theoretically will spread out to a layer with thickness (if uniform) of 6 µm on glass 312. Note that drop 305 wets the surface of glass 312. (Drop volume in the range of 4 to 10 microliters per square inch of wafer surface provides good bonding.)

Figure 2A:
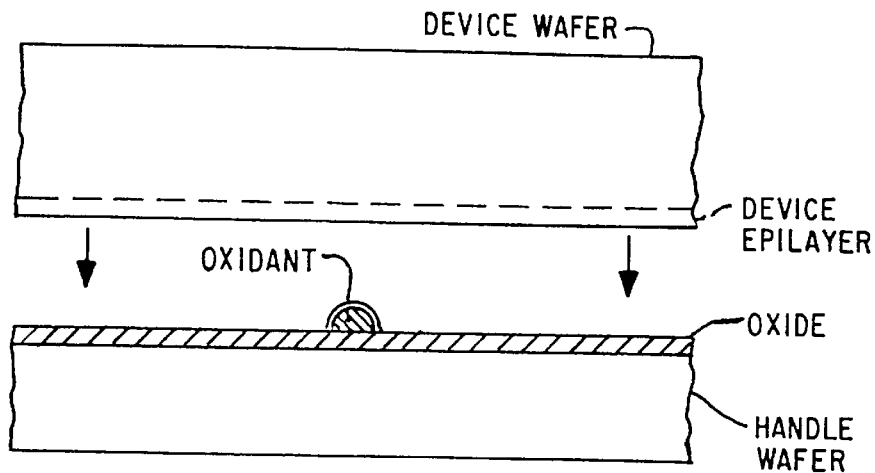
FIGS. 2a–2c show wafer bonding with an oxidizer.
Figure 2B:
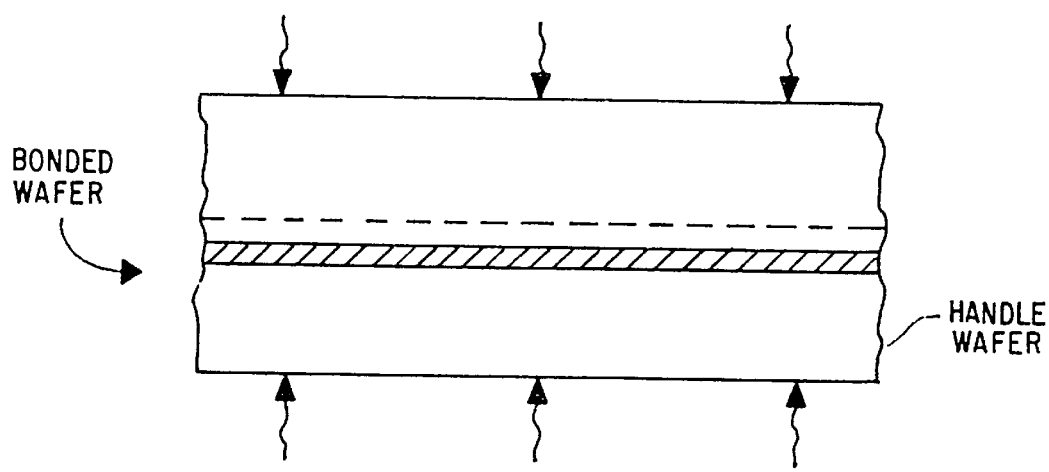
Figure 2C:
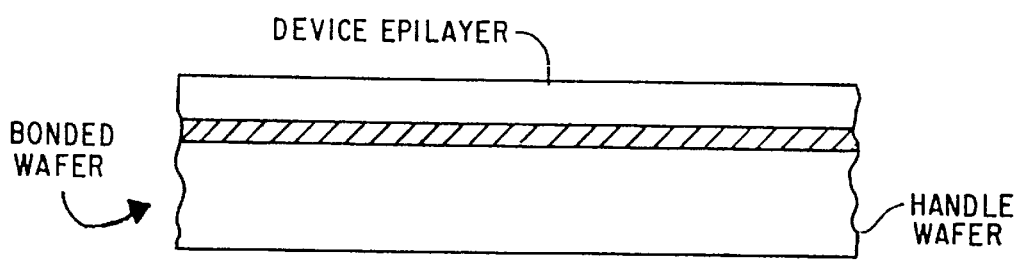

(b) Press handle wafer 312 and device wafer 302 together with drop 305 of oxidizer on the surface of wafer 312. Let the pressed together wafers dry for 24 hours and then heat them to 800–1000° C. in a 2–6 hour furnace cycle with an oxidizing ambient. This low temperature bonding does not depend primarily on thermal oxidation of silicon as in the process of FIGS. 2a–c, but is coupled with an oxidation reduction reaction of nitrate oxidizing the silicon of wafer 302 coupled with slow thermal oxidation. See FIG. 3b. The nitrate forms both silicon-oxygen and silicon-nitrogen bonds. The silicon oxidation reaction also provides sufficient energy to form cross linking bonds between the glass surface and the silicon oxynitride by double bonds being replaced by pairs of single bonds. In effect, mixtures of silicon oxides and nitrides form in a bonding zone, and the water from drop 305 primarily evaporates. The reaction heuristically is:

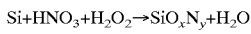

$$Si+HNO_3+H_2O_2 \rightarrow SiO_xN_y+H_2O$$

This creates bonded zone 315 of silicon oxynitrides connecting the remainder of device wafer 302 to handle wafer 312. Bonded zone 315 has a thickness of roughly 500–800 Å and average values of x and y of roughly 1.6 and 0.4, respectively. Of course, increasing the ratio of $HNO_3$ to $H_2O_2$ will increase x and decrease y and somewhat increase the thickness of bonded zone 315; and conversely for a decrease in the ratio. Note that using very little (or none) $HNO_3$ requires the higher temperatures of the process of FIGS. 2a–c because the oxidation of silicon 302 becomes almost totally thermal oxidation.

(c) After bonding, remove the bulk of device wafer 302 by grinding, lapping, and polishing to leave the desired device island thickness; for example, 1 µm.

Figure 3A:
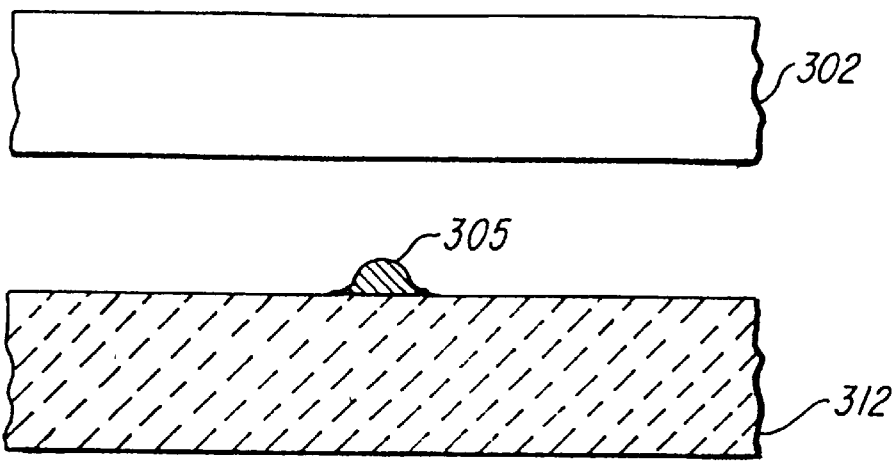
FIGS. 3a–3f illustrate in cross sectional elevation views a first preferred embodiment method for integrated circuit fabrication.
Figure 3B:
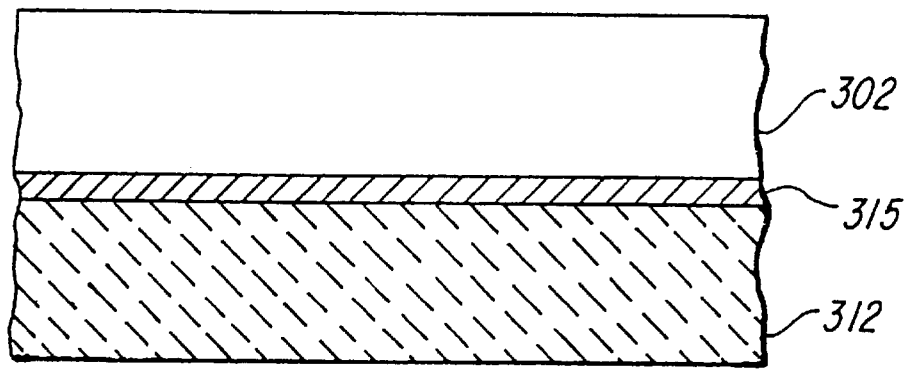
Figure 3C:
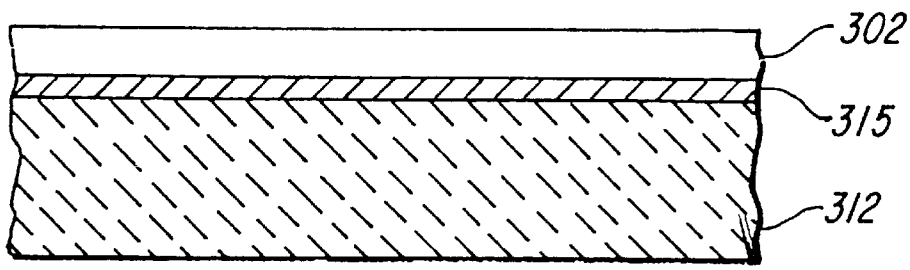
Figure 3D:
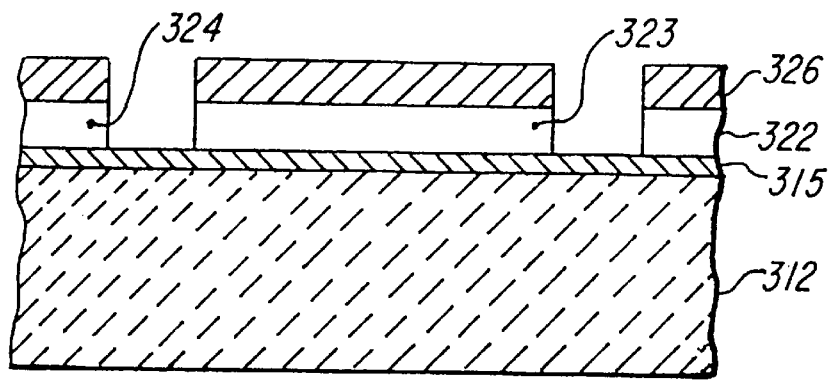

(d) Deposit mask oxide 326 on device wafer 302 to a thickness of about 1 µm. Mask oxide 326 will be used as an isolation trench etch mask. Print a trench pattern into photoresist spun onto mask oxide 326. Use the patterned photoresist as etch mask to wet etch (HF) the trench pattern in oxide 326. The wet etch has minimal effect on glass 312 because of its short duration. Then strip the photoresist and use the patterned oxide 326 to plasma reactive ion etch (RIE) device wafer 302 to form silicon islands 322, 323, . . . as shown in FIG. 3d.

Figure 3E:
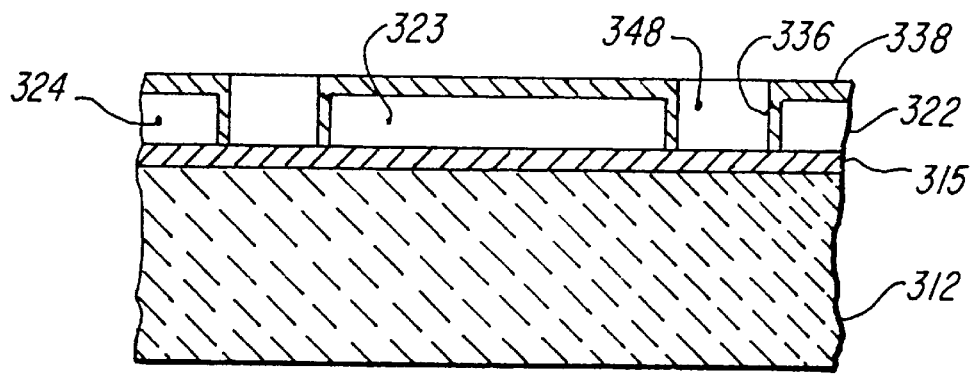
Figure 3F:
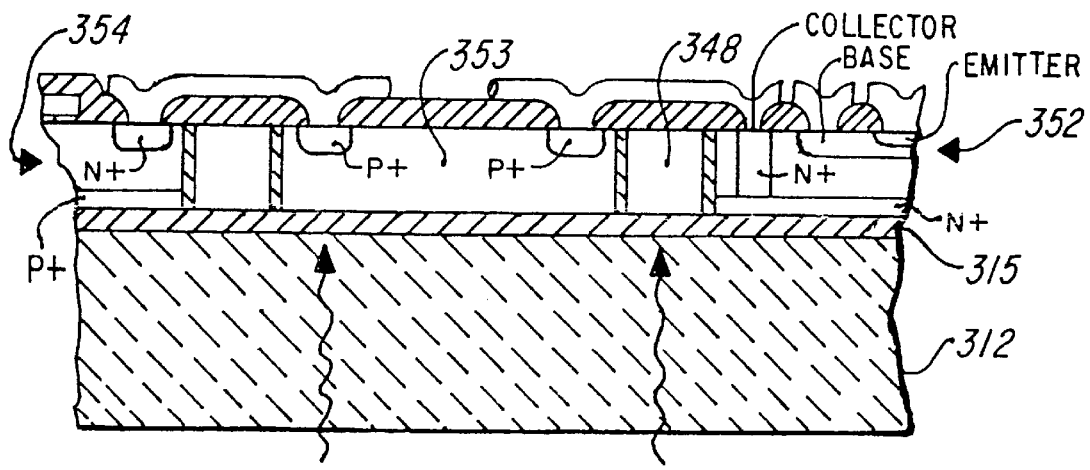

(e) Strip patterned oxide 326 with a wet etch. Then thermally grow or deposit oxide to a thickness of 1.0 µm to form isolation oxide 336 on the sides of islands 322, 323, . . . This also forms 1.0 µm of oxide 338 on the island surfaces. Next, deposit polysilicon 348 to fill the trenches. Lastly, planarize to remove the polysilicon except from the trenches, as illustrated in FIG. 3e.

(f) Fabricate devices in islands 322, 323, . . . with standard processing steps including for bipolar and field effect transistors buried layers abutting the oxynitride 315 bonded zone, but not for photodetectors. In particular, boron and phosphorus may be implanted to a depth of about 1 µm to form buried collectors for bipolar transistors and buried layers for field effect transistors; whereas a photoresistor has no buried layer. Thus visible light entering glass handle wafer 312 from the backside will pass through oxynitride bonded zone 315 (which is transparent) and into photoresistor 353 to modulate its conductivity. The high conductivity of the buried layers for NPN bipolar 352 and NMOS 354 implies light absorption; this prevents any optical coupling from affecting the performance of these transistors. Note that the integrated circuit needs no special topside access for the light.

Rather than photoresistor 353, a photodiode or a phototransistor could been fabricated and used as the photodetector. Of course, any other type of optical-to-electrical converter could be used which is compatible with circuit integration.

Optical coupling

Figure 4:
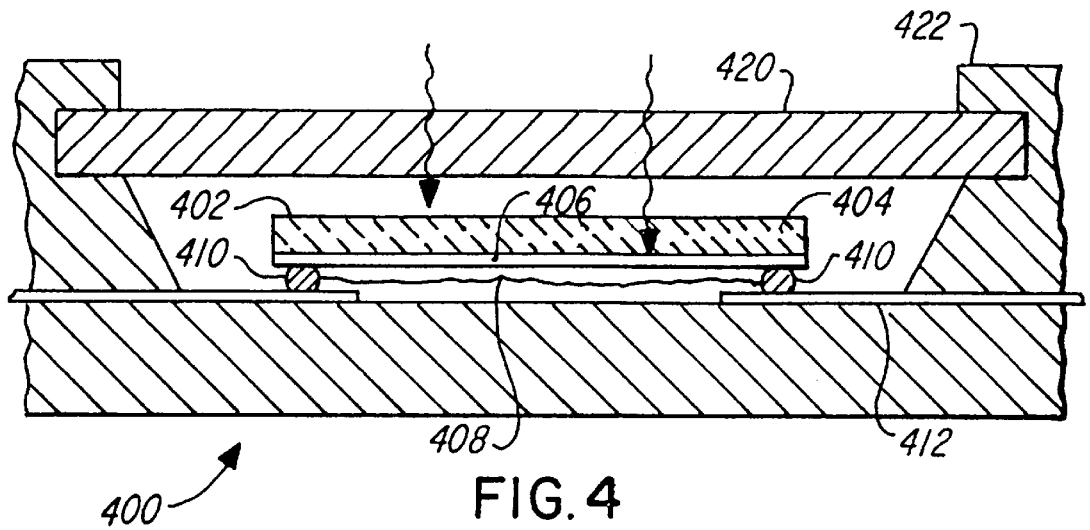
FIG. 4 shows packaging of a preferred embodiment die.

FIG. 4 heuristically shows glass substrate integrated circuit die 402, fabricated by the first preferred embodiment method including a photodetector for backside light, within the package chip system 400. Die 402 includes glass substrate 404, silicon device layer 406, and interconnection, insulation, and overcoat layers 408. Bump or tab bonds 410 connect bond pads on die 402 to package electrical leads 412. The package has a transparent glass or plastic window 420 for light access to substrate 404 and photodetectors in silicon device layer 406; the remainder of the packaging 422 may be opaque plastic. Thus die 402 can receive information optically through window 420, and die 402 is mounted glass substrate side up; and die 402 can transmit and receive information electrically over package leads 412. The thickness of silicon device layer 406 is designed to allow absorption in undoped or lightly regions.

Figure 5:
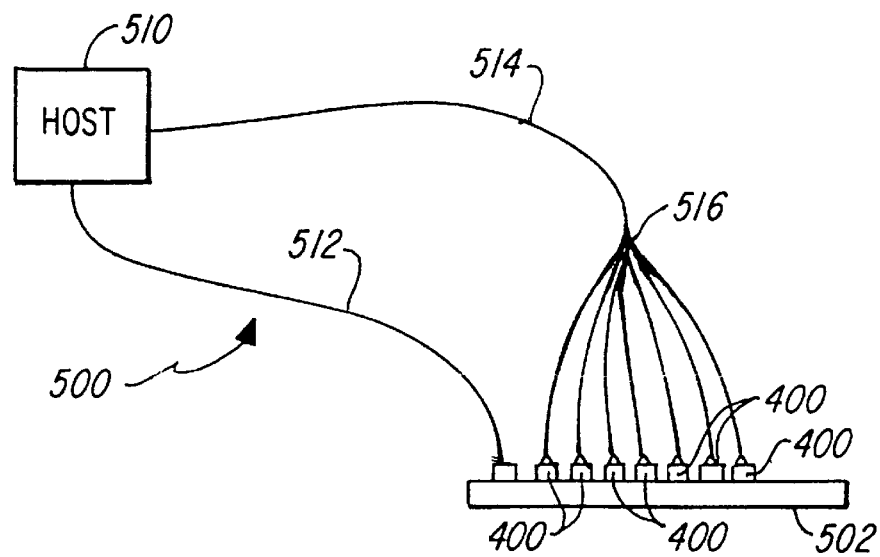
FIG. 5 illustrates an optical signal transmission system.

FIG. 5 illustrate system 500 including multiple chips 400 mounted on printed circuit board 502. Host computer 510 communicates with chips 400 via electrical cable 512 connecting to board 502 in standard manner and also sends information, such as clock signals, via optical fiber cable 514 to all of the chips 400 simultaneously. Optical fiber cable 514 has a splitter 516 and equilength fibers to each of chips 400, thus a signal sent by host 510 over optical fiber cable 514 will be able to synchronize all of chips 400. Indeed, other chips 400 on different printed circuit boards could also be synchronized by just insuring the equal lengths of the coupling optical fibers. In particular, chips 400 could be parallel microprocessors and optical fiber(s) 514 could provide clock signals to all chips 400 plus additional optical fibers could provide data to selected ones. Note that glass substrate 404 may be on the order of 1 cm square, whereas optical fibers typically have an inside diameter of 50 µm. Further, glass substrate and window 420 may each be about 500 µm thick; thus several optical fibers can be attached to a chip 400 to provide several signals and with sufficient separation to avoid crosstalk.

Figure 6:
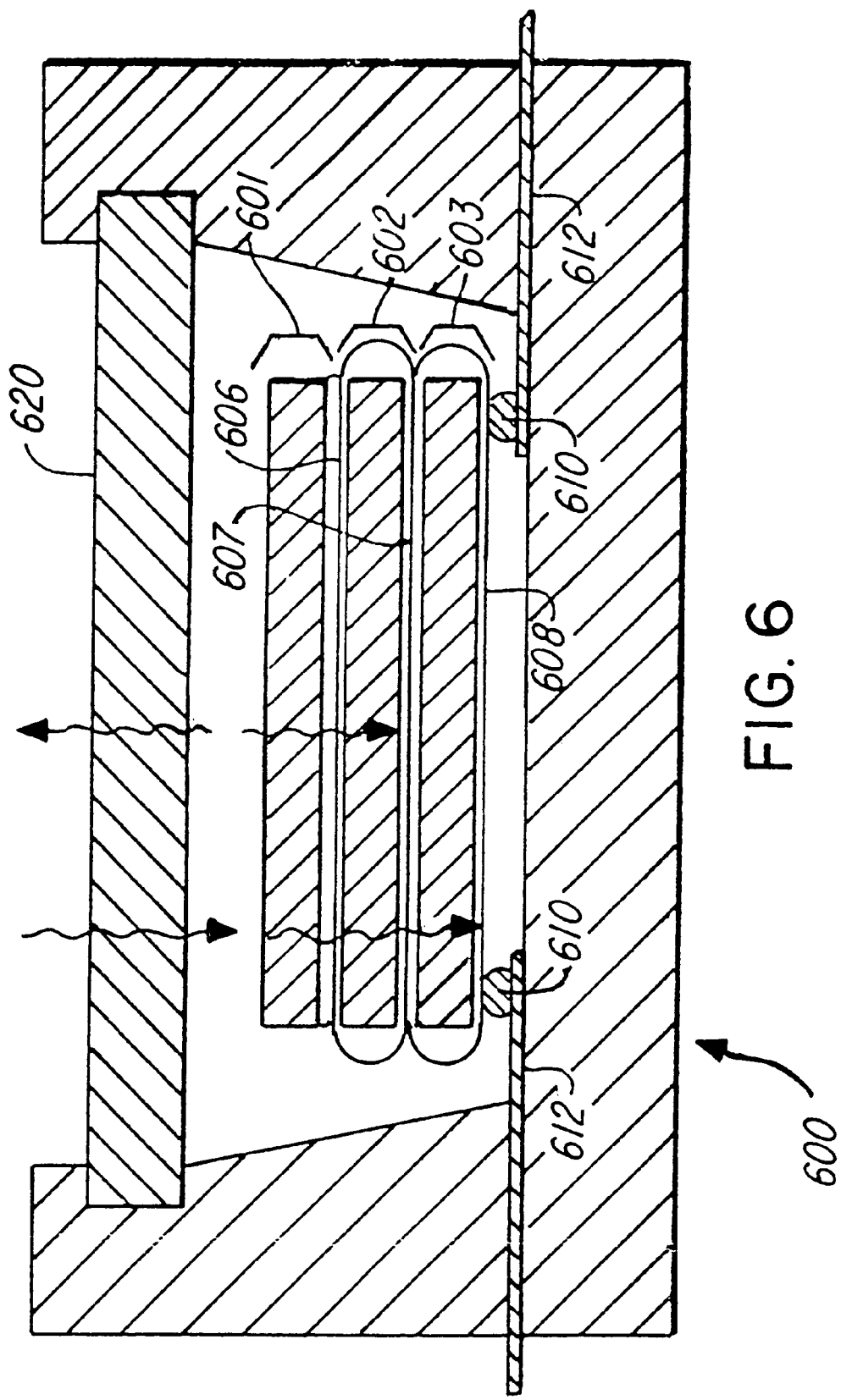
FIG. 6 shows a preferred embodiment stack of optically connected dice.

FIG. 6 shows chip 600 as a stacked dice variation of chip 400 of FIG. 4. In FIG. 6 glass substrate dice 601, 602, and 603 (each analogous to die 402) are stacked with die 603 bonded to lead 612 by bump or tab bonds 610, analogous to die 402 of FIG. 4. Additionally, die 602 is glued to die 603 and power and ground electrical bond wires make edge connections. Similarly, die 601 is glued to die 602 with power and ground bond wire edge connections. Transparent window 620 again permits information-carrying light to enter and activate photodetectors in the semiconductor layers 606 of dice 601 or allow light generated by the semiconductor layer to leave the package. Eliminating the silicon, interconnections, insulation, and overcoat from areas of dice 601 and 602 insures light passing through window 620 reaches down to phototectors in die 603. Similarly, a bare area in die 601 insures light from window 620 to pass to photodetectors in die 602. However, insulation and overcoats of silicon dioxide and silicon nitride are transparent and need not be eliminated, only conductive active areas and interconnects will impede light transmission. Thus clock and data from a host over a optical fiber to window 620 can synchronize the circuitry on dice 601–603, and die 603 provides electrical input and output over leads 612.

Figure 7:
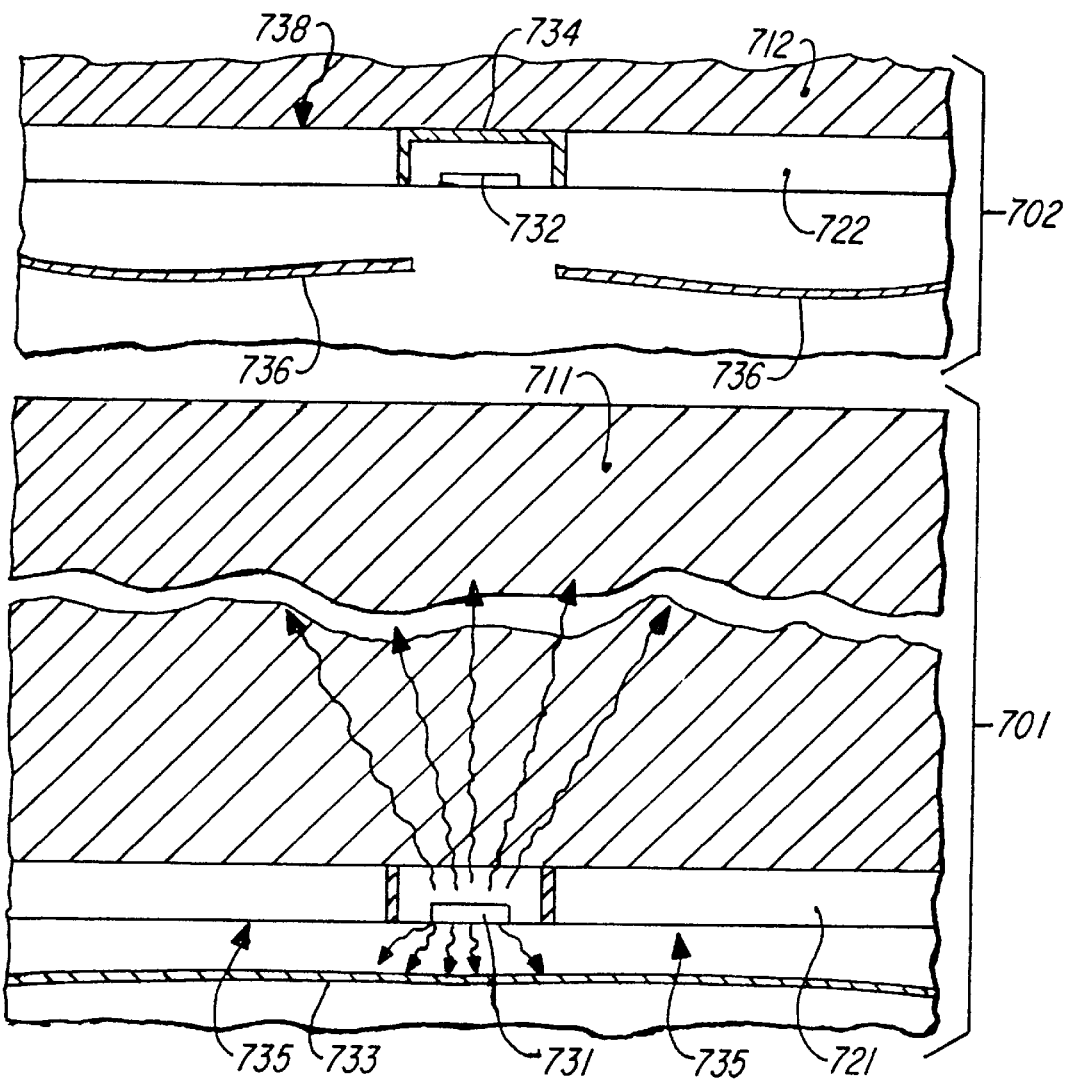
FIG. 7 illustrates a portion of the structure of FIG. 6.

Dice 601–603 communicate among themselves optically as heuristically illustrated in FIG. 7. In particular, portions of dice 701 and 702 are shown with glass substrates 711 and 712 and semiconductor layers 721 and 722, respectively. Semiconductor layer 721 contains light emitting diode (LED) 731 which emits (infrared) light in all directions but preferentially perpendicular to the LED junction plane. Light emitted downwards in FIG. 7 is absorbed by metal film 733 formed in the insulation, interconnect, and overcoat of die 701; this may be part of a second or third level metalization and extends horizontally well beyond LED 731. Note that other circuitry which is light insensitive can be situated in regions 735, so the extent of metal shield 733 does not reduce the die circuit area. Die 702 contains photodetector 732 in semiconductor layer 722 which detects light from LED 731. Die also contains doped buried layer 734 to stop light which passes photodetector 732 plus annular metal layer 736 which absorbs light from LED 731 which will not impinge photodetector 732. As with metal shield 733 and device regions 735, circuitry (which may be light sensitive) can be formed in regions 738 and not be affected by light from LED 731. Thus metal shields 733 and 736 protect the other circuitry of die 702 and any die beneath die 701 from the light of LED 731. Because the thickness of glass substrate 711 is about 500 μm and this is the majority of the distance from LED 731 to photodetector 732, shield 736 should extend roughly 2000 μm from photodetector 732. Note that dice 701–702 are roughly 10,000 μm wide, so locating the LED and the photodetector near the corners of the dice reduces the shielded area to about 4% of the total die area. Thus electrical signals in the circuitry of die 701 can be communicated to die 702 by conversion to optical signals in LED 731 and subsequent detection and conversion back to electrical signals by photodetector 732 in die 702.

For communication from die 702 to die 701, a symmetrical structure can be used. In particular, an LED in die 702 would have an extensive buried layer as the analog of shield 733, and a photodetector in die 701 would have an extensive annular buried layer as the analog of annular shield 736 and a small metal layer as the analog of buried layer 734. Again, the LED converts electrical signals to optical, and the photodetector converts from optical back to electrical.

Lastly, because silicon is an indirect bandgap semiconductor, single crystal silicon does not yield very efficient LEDs. Consequently, use of semiconductors such as amorphous silicon, gallium arsenide, and aluminum gallium arsenide may provide simpler communication structures. Of course, other types of convenient electrical-to-optical converters such as laser diodes could be used.

Thermal isolation

Figure 8:
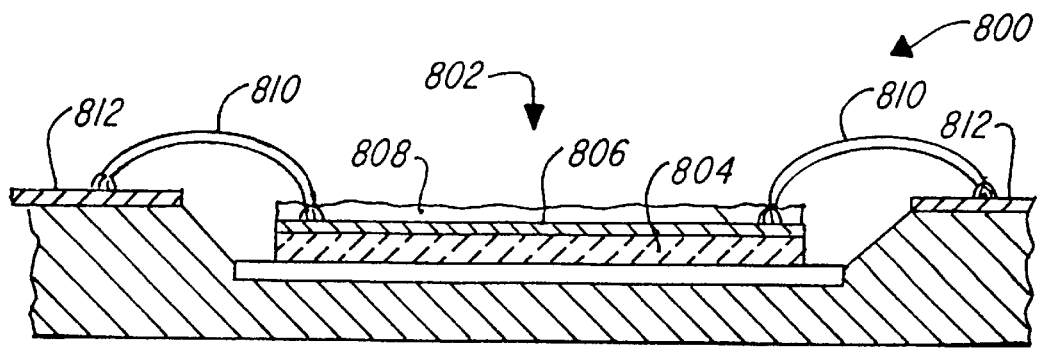
FIG. 8 shows packaging of another preferred embodiment die.
Figure 9A:
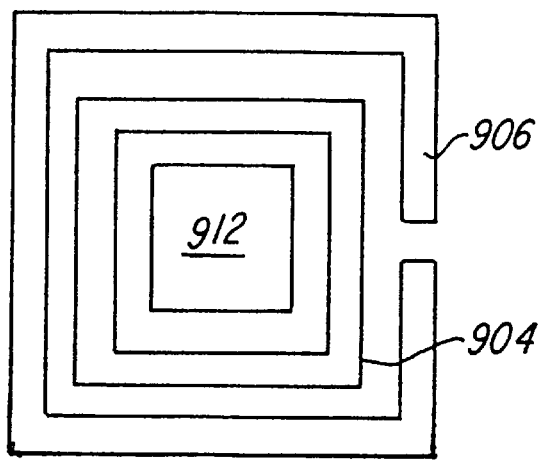
FIGS. 9a–9b illustrate die temperature regulation.

FIG. 8 heuristically shows glass substrate integrated circuit die 802, fabricated by the first preferred embodiment method, within packaged system chip 800. Die 802 includes glass substrate 804, silicon device layer 806, and interconnection, insulation, and overcoat layers 808. Bond wires 810 connect bond pads on die 802 to package leads 812. Die 802 does not include photodetectors, but rather uses the high thermal resistivity of glass 804 to thermally isolate the active circuit from the package. The advantages of thermal isolation using a glass substrate integrated circuit combined with a regulated heater circuit for controlling the temperature of a semiconductor device is disclosed in the following. In the example shown, the semiconductor device includes a zener voltage reference 912. As known to those skilled in the art, the voltage of the zener voltage reference is relatively stable with temperature. The circuit connected to the zener is not shown but as would be known to those skilled in the art may be any circuit employing such a zener voltage reference 912: Further, any other electronic component may be substituted for the zener voltage reference 912 in accordance with the principles of the invention. As shown, a heater, 906 surrounds the electrical component shown as zener voltage reference 912 within the glass substrate integrated circuit die. Further, a temperature sensor 904 may be used to provide an indication of the temperature of the zener 912. In the example shown in FIG. 9a, the temperature sensor 904 provides a relatively large change in voltage per degree change in temperature, as an indication of the temperature of the electronic component shown as the zener voltage reference 912.

Figure 9B:
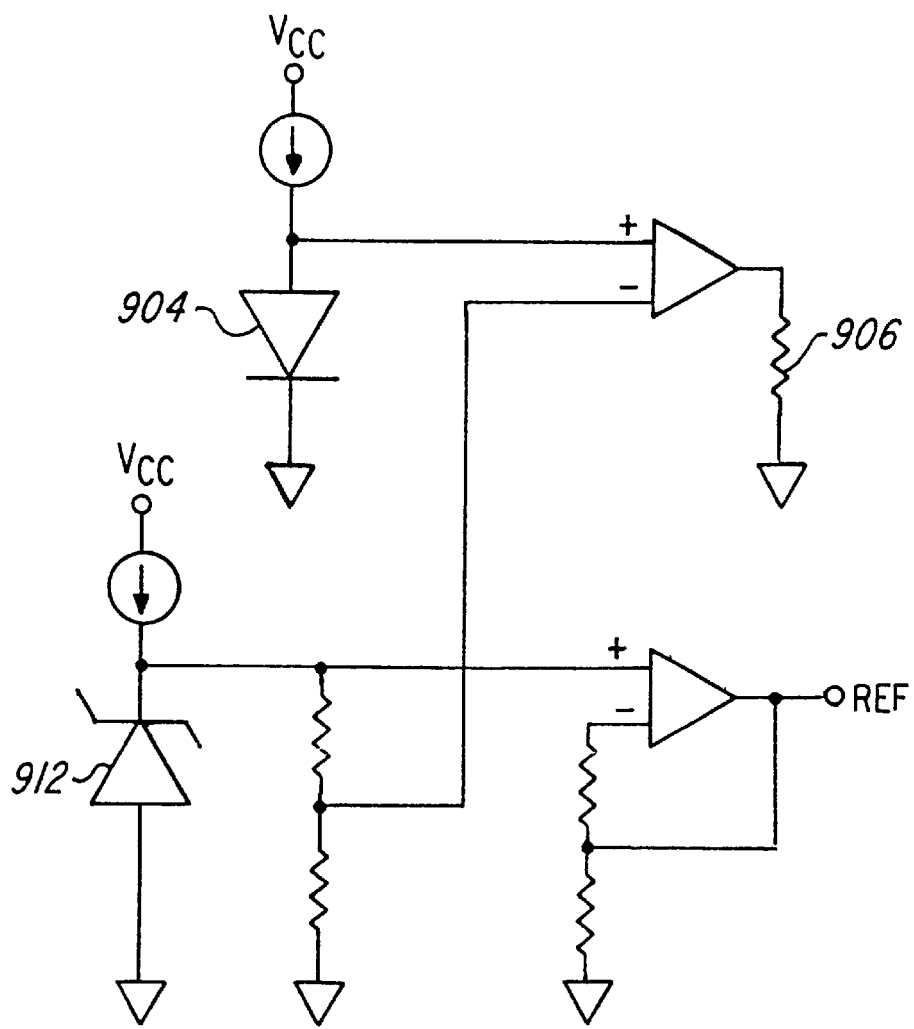

As understood to those skilled in the art, the zener voltage reference provides a relatively stable reference voltage. These two voltages may be combined as shown in FIG. 9b to control the current to heater 906 and to control the temperature of the circuit contained in the glass substrate integrated circuit die. The loss of the heat provided by heater 906 will be reduced by the high thermal resistivity of glass as compared to silicon; thus, improving the thermal efficiency of the circuit.

Modifications and Variations

The preferred embodiments may be changed in many ways while retaining the features of a glass substrate for optical communication or for thermal isolation. The following are some illustrative examples:

The light color used can be varied from near infrared to ultraviolet and still have good coupling to practical semiconductor materials and not be significantly absorbed by glass.

The die edge bonding of the stack of dice 601–603 could be replaced with planar bonding as follows: die 601 would be slightly longer than die 602 which, in turn, would be slightly longer than die 603; thus when stacked together the die ends resemble a staircase with bond pads for power and ground exposed for planar bonding.

Figure 10:
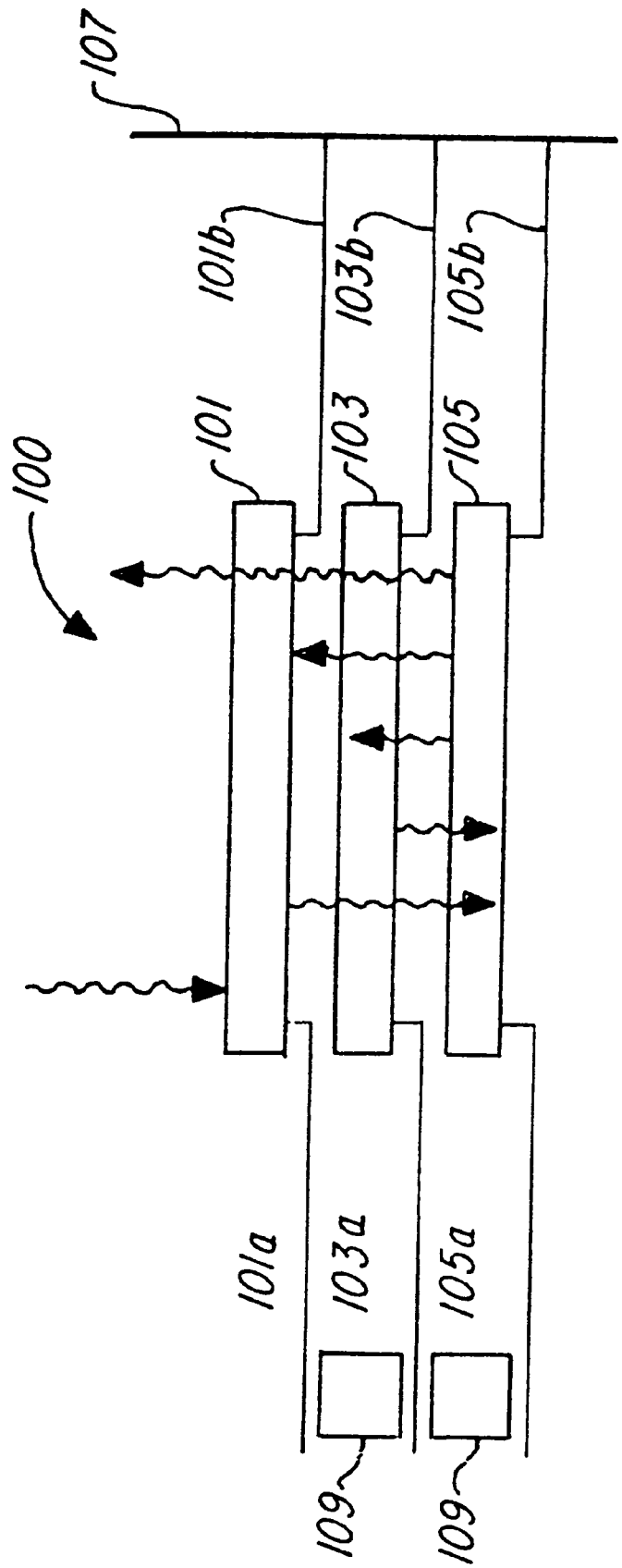
FIG. 10 illustrates a package embodiment employing a stack of TAB bonded die.

As shown in FIG. 10, the dice shown as 101, 103 and 105 are shown arranged in a stack 100. As shown by the arrows, each individual die, 101,103 or 105 may receive information from any other die or from outside the die stack 100. Each die as shown by the arrows may transmit information to any other die in the stack 100 or outside the stack 100. The dice may be connected individually to a link frame shown as link 101A and 101B for die 101, 103A and 103B for die 103, and 105A and 105B for die 105. As shown in the preferred embodiment the die may be connected by TAB leads to a common bus shown as 107 or to separate information input/output lines separated by conductive spaces shown as 109. TAB leads may be added as known to those skilled in the art to supply power or other inputs needed to implement the die functions within a system. The connection of dice by TAB leads are well known to those skilled in the art and not discussed in detail.

Each die is TAB bonded to a lead frame prior to stack assembly, then the TAB leads could be bonded together or connected with conductive spacers.

The bonding oxidizer of drop 305 could be replaced other oxidizers such as aqueous $HClO_4$. For example, the drop could be 50% $HNO_3$, 20% $HClO_4$ and 30% $H_2O_2$, or 100% $HClO_4$. The same relatively low temperature bonding occurs, and the chlorine ends up bonded in the interface bond layer. The chlorine will not affect the optical transparency of the bonded zone for visible light.

A double epitaxial bonded wafer technique could be used by (i) bonding a heavily doped silicon wafer having a lightly doped epitaxial layer to a glass handle wafer; next, (ii) grinding, lapping, and polishing followed by electrochemical etching (HF plus current flowing through the heavily doped substrate) to leave the lightly doped epilayer; then (iii) selectively doping regions of the epilayer which will eventually become buried layers; and lastly, (iv) growing another epilayer for device formation.

We claim:

1. A method of fabricating a bonded wafer having a single crystal semiconductor layer and a glass substrate comprising the steps of:

(a) providing a single crystal semiconductor wafer that is devoid of porous semiconductor material;

(b) providing a glass substrate that is devoid of porous semiconductor material;

(c) providing a semiconductor-oxidizing liquid between a first surface of said single crystal semiconductor wafer and a first surface of said glass substrate;

(d) pressing said single crystal semiconductor wafer against said glass substrate, so that said semiconductor-oxidizing liquid provided therebetween contacts said first surface of said single crystal semiconductor wafer and said first surface of said glass substrate in a pressed together laminate, and causes a semiconductor oxidation reaction that forms a bonding zone between said first surface of said single crystal semiconductor wafer and said first surface of said glass substrate; and (e) forming semiconductor devices in said single crystal semiconductor wafer that has been bonded to said glass substrate in step (d).

2. A method according to claim 1, wherein step (c) comprises placing a drop of said semiconductor-oxidizing liquid on one of said first surface of said single crystal semiconductor wafer and said first surface of said glass substrate, and allowing said semiconductor-oxidizing liquid to spread out and wet said one of said first surface of said single crystal semiconductor wafer and said first surface of said glass substrate.

3. A method according to claim 2, wherein step (d) comprises allowing said single crystal semiconductor wafer and said glass substrate as pressed thereagainst to dry, and then heating said laminate within a prescribed range of time and temperature.

4. A method according to claim 2, wherein said single crystal semiconductor wafer is a single crystal silicon wafer, and wherein said semiconductor-oxidizing liquid comprises an aqueous silicon-oxidizing solution, such that said bonding zone resulting from said semiconductor oxidation reaction in step (d) contains silicon-oxygen bonds.

5. A method according to claim 4, wherein said bonding zone has a thickness in a range on the order of 500–800 Angstroms.

6. A method according to claim 4, wherein said semiconductor-oxidizing liquid comprises an aqueous silicon-oxidizing solution containing at least one of a nitrate and a chlorate, such that said bonding zone resulting from said semiconductor oxidation reaction in step (d) further contains at least one of silicon-nitrate and silicon-chlorate bonds.

7. A method according to claim 2, wherein said semiconductor-oxidizing liquid comprises an aqueous silicon-oxidizing solution of $HNO_3$ and $H_2O_2$, such that said bonding zone resulting from said semiconductor oxidation reaction in step (d) is a silicon oxynitride bonding zone.

8. The method according to claim 1 wherein said semiconductor devices include at least one light processing device for receiving or transmitting light through the glass substrate of the bonded wafer.

9. The method according to claim 1 further comprising the steps of:

forming light processing devices in the single crystal semiconductor layer for receiving light and generating signals; and forming light absorbing regions in the semiconductor layer for blocking light.

10. The method according to claim 1 further comprising the steps of:

forming light processing devices in the single crystal semiconductor layer for transmitting light; and forming light absorbing regions in the semiconductor layer for blocking light.

11. A method of forming a laminate semiconductor structure comprising the steps of:

(a) providing a silicon wafer containing single crystal silicon and being devoid of porous semiconductor material anywhere between first and second opposite sides of said silicon wafer;

(b) providing a glass substrate containing silicon glass and being devoid of porous semiconductor material anywhere between first and second opposite sides of said glass substrate;

(c) placing a silicon-oxidizing liquid on one of said first side of said silicon wafer and said first side of said glass substrate, and allowing said silicon-oxidizing liquid to spread out and wet said one of said first side of said silicon wafer and said one side of said glass substrate; and (d) pressing said first side of said silicon wafer said first side of said glass substrate against one another, so that, as said silicon wafer and said glass substrate are pressed together into a laminate, said silicon-oxidizing liquid contacts each of said first side of said silicon wafer and said first side of said glass substrate and causes a silicon oxidation reaction that forms a silicon-oxygen bonding zone between said first side of said silicon wafer and said first side of said glass substrate; and (e) forming semiconductor devices in said silicon wafer that has been bonded to said silicon glass substrate in step (d).

12. A method according to claim 11, wherein step (d) comprises allowing said laminate to dry, and then heating said laminate within prescribed ranges of time and temperature.

13. A method according to claim 11, wherein said silicon-oxidizing liquid comprises an aqueous silicon-oxidizing solution containing at least one of a nitrate and a chlorate, such that said bonding zone resulting from said silicon oxidation reaction in step (d) contains at least one of silicon-nitrate and silicon-chlorate bonds.

14. A method according to claim 13, wherein said aqueous silicon-oxidizing solution contains $HNO_3$ and $H_2O_2$ such that said bonding zone resulting from said silicon oxidation reaction in step (d) is a silicon oxynitride bonding zone.

15. A method according to claim 14, wherein said silicon oxynitride bonding zone has a thickness in a range on the order of 500–800 Angstroms.

* * * * *